(12) United States Patent
Faber

(10) Patent No.: US 6,853,182 B2
(45) Date of Patent: Feb. 8, 2005

(54) PROXIMITY SWITCH

(75) Inventor: Michael Faber, Lüdenscheid (DE)

(73) Assignee: Werner Turck GmbH & Co.KG, Halver (DE)

( * ) Notice: Subject to any disclaimer, the term of this patent is extended or adjusted under 35 U.S.C. 154(b) by 150 days.

(21) Appl. No.: 10/012,973

(22) Filed: Nov. 5, 2001

(65) Prior Publication Data
US 2002/0093406 A1 Jul. 18, 2002

(30) Foreign Application Priority Data
Nov. 22, 2000 (DE) .......................................... 100 57 773

(51) Int. Cl.$^7$ ................................................ G01B 7/14
(52) U.S. Cl. .............................. 324/207.15; 324/207.26
(58) Field of Search ........................ 324/207.15–207.17, 324/207.26; 340/551, 561, 562, 870.31; 307/116, 125

(56) References Cited

U.S. PATENT DOCUMENTS

| | | | |
|---|---|---|---|
| 4,618,823 A | | 10/1986 | Dahlheimer |
| 4,719,362 A | | 1/1988 | Nest |
| 4,841,163 A | | 6/1989 | Mueller |
| 4,879,531 A | | 11/1989 | Tigges |
| 5,012,206 A | | 4/1991 | Tigges |
| 5,239,204 A | | 8/1993 | Mueller |
| 5,264,733 A | | 11/1993 | Tigges |
| 6,043,644 A | * | 3/2000 | de Coulon et al. ..... 324/207.18 |
| 6,175,232 B1 | * | 1/2001 | De Coulon et al. ..... 324/207.12 |
| 6,313,724 B1 | * | 11/2001 | Osterweil ................... 335/207 |
| 6,404,192 B1 | * | 6/2002 | Chiesi et al. ............... 324/253 |
| 6,545,464 B1 | * | 4/2003 | Tigges et al. .......... 324/207.26 |
| 6,611,138 B2 | * | 8/2003 | Vasiloiu ................. 324/207.12 |
| 6,633,158 B1 | * | 10/2003 | Shen et al. ............ 324/207.26 |

FOREIGN PATENT DOCUMENTS

| | | | | |
|---|---|---|---|---|
| DE | 2140379 B | * | 6/1978 | .......... H03K/17/00 |
| DE | 4031252 | | 10/1991 | |
| JP | 06060783 A | * | 3/1994 | .......... H01H/36/00 |
| JP | 07037476 A | * | 2/1995 | .......... H01H/36/00 |

OTHER PUBLICATIONS

Machine translation of JP 406060783 A, from JPO website, http://www.ipdl.jpo.go.jp.*

* cited by examiner

Primary Examiner—N. Le
Assistant Examiner—Reena Aurora
(74) Attorney, Agent, or Firm—Martin A. Farber

(57) ABSTRACT

Proximity switch with a coil arrangement having at least one coil and an evaluation circuit arranged downstream of said coil arrangement for obtaining a switching signal when a trip feature of the coil arrangement approaches a desired response distance, wherein the at least one coil is formed by coil sections (8) connected electrically in series, preferably disposed next to one another, axially in parallel, with a same winding direction.

17 Claims, 2 Drawing Sheets

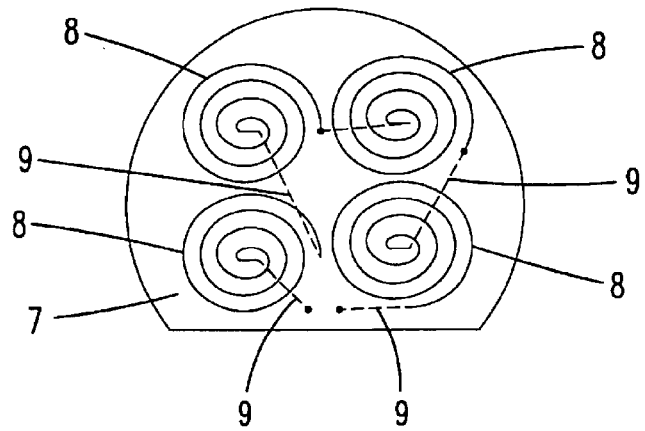
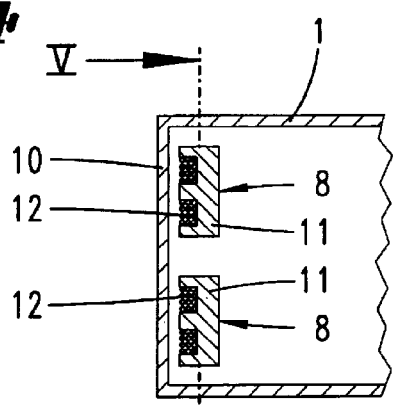
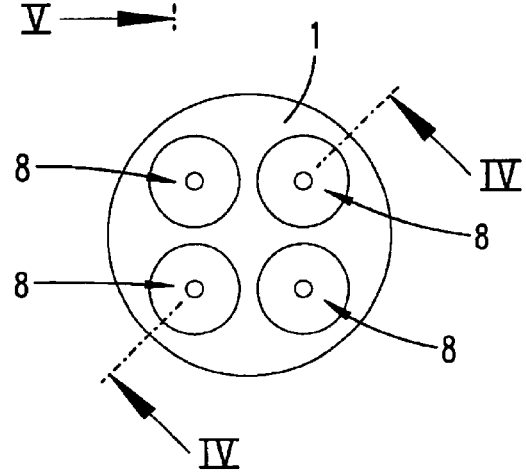

PROXIMITY SWITCH

FIELD AND BACKGROUND OF THE INVENTION

The invention relates to a proximity switch with a coil arrangement having at least one coil and an evaluation circuit arranged downstream of the said coil arrangement for obtaining a switching signal when a trip feature of the coil arrangement approaches the desired response distance.

Proximity switches of this type are known in the prior art.

Inductive proximity switches in particular can be divided into two groups. There are what are known as non-flush-mountable proximity switches, which have the greatest possible operating distance with respect to the device diameter, and consequently coil diameter. These proximity switches must have around their active surface a certain free zone for metallic parts, in order not to change their operating distance significantly during mounting. If such proximity switches are fitted in the direct vicinity of metal masses, they lose their switching capability. The advantage of non-flush-mountable proximity switches of this type is their great operating distance.

On the other hand, there are flush-mountable proximity switches. In the case of these proximity switches, an internal shielding of the coil system provides an insensitivity to metal masses arranged alongside the proximity switch. This safeguard against unwanted influences is obtained at the expense of the disadvantage that their operating distance is considerably less than that of the non-flush-mountable proximity switches.

A proximity switch in which an alternating magnetic field is generated by a coil, which coil is located between two differential coils, is shown by DE 40 31 252. A differential voltage is induced in the two receiving coils and returned to the input of an oscillator amplifier. This voltage becomes zero at precisely that moment at which the object to be sensed is at the desired operating distance. The coil combination must be adapted specifically to the operating point with regard to its number of turns and its spatial position. In the case of a proximity switch of this type, the oscillator changes its oscillating state abruptly, which is detected by an evaluation circuit.

Also known in the prior art are inductive proximity switches in which the coil is part of an LC oscillator. The alternating electromagnetic field produced by the coil generates eddy currents in an approaching ferromagnetic object to be sensed. These currents draw energy from the oscillator. This leads to a reduction in the oscillation amplitude of the oscillator. This is detected by the evaluation circuit.

All the proximity switches described above share the problem that a shielding of the coil arrangement is needed if they are disposed in the vicinity of metal masses (flush mounting), which is accompanied by the disadvantage that the operating distance is reduced.

SUMMARY OF THE INVENTION

The invention is based on the object of proposing means which counteract this disadvantage.

The object is achieved by the invention provided in the claims.

In particular, the at least one coil is formed by coil sections connected electrically in series, preferably disposed next to one another, axially in parallel, with the same winding direction. This arrangement brings the surprising advantage that at least this coil no longer needs to be shielded. A proximity switch of this kind can nevertheless be operated in the direct vicinity (flush-mounted position) of metal masses. A sensitivity to the change in field strength equivalent to that of a large coil is achieved at the center of the active surface, but the sensitivity becomes significantly less towards the outer edge than in the case of a large coil. Instead of a large coil, a plurality of coils with a smaller diameter are used. In a development of the invention, it is provided that the coil sections are formed as planar coils disposed on a plate. This simplifies production. It is also possible, however, to wind the coils from wire around a coil former in the conventional way. The coil sections may form at least one of the two differential coils of a proximity switch having a transmitting coil and two differential coils. In this case, it may even be provided that the transmitting coil located-between the two differential coils is shielded. On the other hand, the coil formed by the coil sections is not to be shielded. The coil sections may be grouped symmetrically around the center of the active surface. It is, for example, advantageous for the coil sections to be four in number. The diameter of the coil sections is considerably less than the diameter of the active surface. The coil which is formed by the plurality of coil sections is intended to lie closest to the active surface. In a development of the invention, it is provided that the coil comprising a plurality of coil sections is the oscillating circuit coil of an inductive proximity switch. In the case of this solution, each coil section may be associated with an individual ferrite coil former. All the coil sections may be formed in the same way.

BRIEF DESCRIPTION OF THE DRAWINGS

Exemplary embodiments of the invention are explained below with reference to the accompanying drawings, in which:

FIG. 3 shows the plate of a receiving coil of the differential coil arrangement, FIG. 4 shows a further exemplary embodiment in a representation according to FIG. 1 and FIG. 5 shows a sectional representation along the line V—V in FIG. 4.

DETAILED DESCRIPTION OF THE PREFERRED EMBODIMENT

Figure 1:
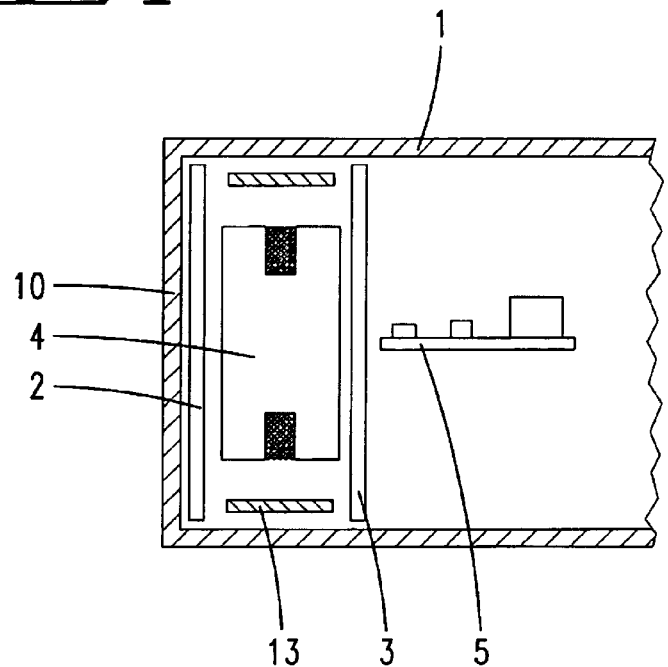
FIG. 1 shows a schematic sectional representation of a proximity switch operating on the differential principle.

The exemplary embodiment represented in FIG. 1 corresponds in its construction and layout to that proximity switch which is described by DE 40 31 252, for which reason reference is made at this point to the statements made there.

One or both of the sensor coils designated in DE 40 31 252 by the reference numerals 12 and 13 is/are developed according to the invention. These two coils are the receiving coils designated in FIG. 1 by the reference numerals 2 and 3. The receiving coil 2 is located directly behind the active surface 10. Located on the coil former to the rear of the receiving coil 2 is the transmitting coil 4, which generates an alternating electromagnetic field. Located to the rear of the transmitting coil 4 is a further receiving coil 3. Located to the rear of the receiving coil 3 is a plate 5 with an evaluation circuit.

The alternating electromagnetic field emitted by the transmitting coil 4 is attenuated in the radial direction by an attenuating ring 13. The axial extent of the attenuating ring 13 extends substantially only the axial length of the transmitting coil 2 (sic), so that the two receiving coils 2, 3 are not shielded in the radial direction.

At least the receiving coil 2, which is connected antisymmetrically in relation to the receiving coil 3, has a construction such as that shown by FIG. 3.

FIG. 3 shows a plate 7, on which four planar coils 8 are provided. The planar coils form the coil sections, which when connected together form the receiving coil 2.

The planar coils 8 have a spiral construction. They are connected to one another via conductive connections 9, represented by dashed lines, running on the rear side of the plate, in such a way that they are connected in series and have the same winding direction.

Figure 2:
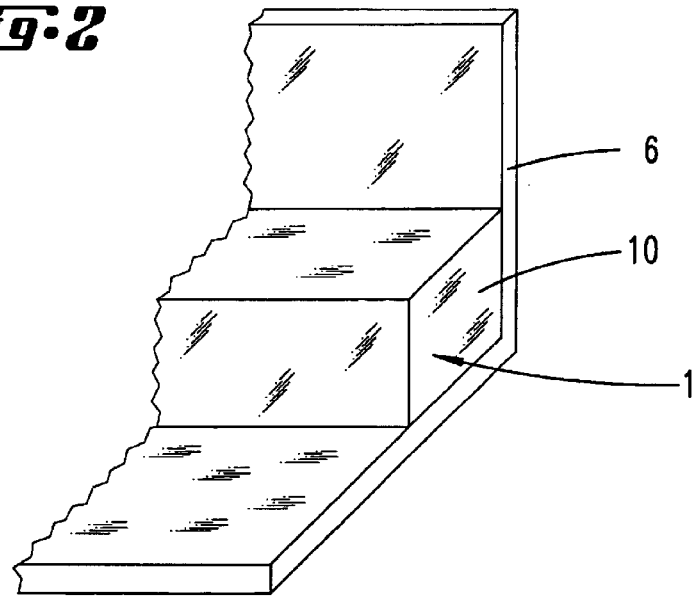
FIG. 2 shows the flush mounting position of a proximity switch of this type.

FIG. 2 shows the mounted position of a proximity switch of this type. Designated in this figure by the reference numeral 6 is a metal angle, in the angle leg of which the rectangular housing of the proximity switch lies in such a way that the active surface 10 terminates flush with the angle.

With conventional, flush-mountable proximity switches with a sensor area diameter of, for example, 40 mm, in which the entire coil arrangement is shielded in the radial direction, operating distances of up to approximately 20 mm can be achieved. On the other hand, in the case of non-flush-mountable proximity switches of the same size, in which the coil arrangement is not shielded, operating distances of up to 40 mm can be achieved.

With the arrangement as proposed by the invention, flush mounting situations with a sensor area diameter of, for example, 40 mm allow operating distances of up to 30 mm to be accomplished.

It is also possible in the case of the second exemplary embodiment to increase the operating distance in the case of flush mounting by dividing a coil. This exemplary embodiment relates to an inductive proximity switch, in which the coil 12 is part of an LC oscillator. Inductive proximity switches of this type are described for example by DE-C 12 86 099. In the drawings, the capacitor and the associated circuit elements, known per se, have been omitted.

What is important is that the coil located directly behind the active surface 10 comprises a multiplicity of coil turns 12, which lie axially parallel next to one another. Each of the coil turns 12 is located on a ferrite core 11 associated with it. The coil sections 8 formed in this way are connected in series in the way described above. They are of the same construction as one another.

All features disclosed are (in themselves) pertinent to the invention. The disclosure content of the associated/accompanying priority documents (copy of the prior application) is hereby incorporated in full in the disclosure of the patent application, partly for the purpose of incorporating features of these documents in claims of the present patent application.

I claim:

1. Proximity switch with a coil arrangement having at least one coil and an evaluation circuit arranged downstream of said coil arrangement for obtaining a switching signal when a trip feature of the coil arrangement approaches a desired response distance, wherein the at least one coil is formed by coil sections (8) connected electrically in series, preferably disposed next to one another, axially in parallel, with a same winding direction, wherein said proximity switch has a ratio of sensor area diameter to operating distance of at least 4:3 for operating distances in excess of 30 mm.

2. Proximity switch according to claim 1, wherein the coil sections (8) are planar coils disposed on a plate (7).

3. Proximity switch according to claim 1, wherein the coil sections (8) form at least one of two differential coils (2, 3) of a proximity switch having a transmitting coil (4) and the two differential coils (2, 3).

4. Proximity switch according to claim 3, wherein the transmitting coil (4) is located between the two differential coils (2, 3) and is shielded by an attenuating ring (13).

5. Proximity switch according to claim 1, wherein the coil formed by the coil sections (8) is not shielded.

6. Proximity switch according to claim 1, wherein the coil sections (8), of which there are in particular four in number, are disposed symmetrically in a plane.

7. Proximity switch according to claim 1, wherein a diameter of the coil sections is considerably less than a diameter of an active surface (10) behind which they are disposed.

8. Proximity switch according to claim 7, wherein the coil formed by coil sections (8) is located closest to the active surface.

9. Proximity switch according to claim 1, wherein the coil formed by the coil sections (8) is an oscillating circuit coil of an inductive proximity switch.

10. Proximity switch according to claim 1, wherein the coil sections (8) each have an associated ferrite coil former (11).

11. Proximity switch as recited in claim 1, wherein said proximity switch is operable in the direct vicinity of metal masses.

12. Proximity switch as recited in claim 1, wherein said switch is flush mountable on a metal mass and has an operating distance of at least 30 mm.

13. Proximity switch as recited in claim 12, wherein said operating distance may be selectively increased by dividing said at least one coil into a plurality of coil sections.

14. Proximity switch with a coil arrangement having at least one coil and an evaluation circuit arranged downstream of said coil arrangement for obtaining a switching signal when a trip feature of the coil arrangement approaches a desired response distance, wherein the at least one coil is formed by coil sections (8) connected electrically in series, preferably disposed next to one another, axially in parallel, with a same winding direction, wherein said proximity switch is flush mountable and has a sensor area diameter of at least 40 mm and operating distances of at least 30 mm.

15. Proximity switch with a coil arrangement having at least one coil and an evaluation circuit arranged downstream of said coil arrangement for obtaining a switching signal when a trip feature of the coil arrangement approaches a desired response distance, wherein the at least one coil is formed by coil sections connected electrically in series, and axially in parallel, with a same winding direction, wherein said proximity switch has a sensor area diameter of at least 40 mm.

16. Proximity switch with a coil arrangement having at least one coil and an evaluation circuit connected to said coil arrangement for obtaining a switching signal when a trip feature of the coil arrangement approaches a desired response distance, wherein the at least one coil is formed by coil sections connected electrically in series, and axially in parallel, wherein said proximity switch has a ratio of sensor area diameter to operating distance of at least 4:3 for operating distances in excess of 30 mm.

17. Proximity switch as recited in claim 16, wherein said proximity switch is flush mountable.

* * * * *